(12) United States Patent
Kim et al.

(10) Patent No.: US 7,825,030 B2
(45) Date of Patent: Nov. 2, 2010

(54) METHOD OF FORMING A SPACER

(75) Inventors: Yu-Kyung Kim, Hwaseong-si (KR);
Kun-Tack Lee, Suwon-si (KR);
Woo-Gwan Shim, Yongin-si (KR);
Chang-Ki Hong, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 12/277,332

(22) Filed: Nov. 25, 2008

(65) Prior Publication Data
US 2009/0137126 A1 May 28, 2009

(30) Foreign Application Priority Data
Nov. 27, 2007 (KR) ................. 10-2007-0121269

(51) Int. Cl.
*H01L 21/311* (2006.01)
(52) U.S. Cl. ................. 438/703; 257/E21.249
(58) Field of Classification Search .......... 438/703; 257/E21.249
See application file for complete search history.

(56) References Cited

U.S. PATENT DOCUMENTS

| 6,245,626 B1 * | 6/2001 | Chen et al. ................. 438/305 |
| 2001/0041427 A1 | 11/2001 | Gehrke et al. |
| 2003/0102476 A1 | 6/2003 | Romano et al. |

FOREIGN PATENT DOCUMENTS

KR 1020070056585 A 6/2007

* cited by examiner

*Primary Examiner*—Charles D Garber
*Assistant Examiner*—Stanetta D Isaac
(74) *Attorney, Agent, or Firm*—Volentine & Whitt, PLLC

(57) ABSTRACT

A sacrificial layer and wet etch are used to form a sidewall spacer so as to prevent damage to the structure on which the spacer is formed and to the underlying substrate as well. Once the structure is formed on the substrate a spacer formation layer is formed to cover the structure, and a sacrificial layer is formed on the spacer formation layer. The sacrificial layer is wet etched to form a sacrificial layer pattern on that portion of the spacer formation layer extending along a sidewall of the structure. The spacer is formed on the sidewall of the structure by wet etching the spacer formation layer using the sacrificial layer pattern as a mask.

8 Claims, 10 Drawing Sheets

METHOD OF FORMING A SPACER

BACKGROUND

1. Field of the Invention

Example embodiments relate to a method of manufacturing a semiconductor device. More particularly, example embodiments relate to a method of forming a spacer on a side wall of a structure of a semiconductor device.

2. Description of the Related Art

The dimensions of certain features of semiconductor devices have been greatly scaled down to meet the current demand for more highly integrated semiconductor devices. For example, the widths of features, the distances between features and the size of contacts, e.g., contact plugs, has all become considerably smaller over time. Included among such features are those formed by a conductive pattern on a substrate. A contact plug may be formed between adjacent features of the conductive pattern to connect conductive regions/elements provided on different layers of the semiconductor device.

However, it is difficult to properly form a contact plug of a semiconductor device between the features of a pattern when the features are minute and are spaced close to one another. A contact plug improperly formed between minute and closely spaced features of a conductive pattern may result in an electrical short between the contact plug and the conductive pattern. Furthermore, an improperly formed contact plug may result in a small area of contact between the contact plug and the substrate. In this case, the contact resistance between the contact plug and a substrate is so great as to adversely affect the operation/quality of the device.

For example, a self-alignment process is typically used to form contact plugs between conductive features spaced from one another by small intervals. In the self-alignment process, a spacer is formed on sidewalls of the conductive pattern, and then an insulation interlayer is formed to cover the conductive pattern and the spacer. The insulation interlayer is then etched to form a self-aligned contact whole extending to a substrate between adjacent features of the conductive pattern. With respect to the etching process, the insulation interlayer and the spacer are formed of respective materials having an etch selectivity such that the insulation interlayer is etched at a significantly greater rate than the spacer. The contact plug is then formed in the contact hole.

However, the spacer is formed by an etching process to be thin and thus ensure a sufficient area of contact between the contact plug and the substrate. In this case, i.e., the case of forming a thin spacer, the conductive pattern and the substrate are likely to be damaged while forming the spacer. As a result, the breakdown voltage between the contact plug and the conductive pattern worsens. Additionally, damage to the substrate, as mentioned above, may increase the contact resistance between the substrate and the contact plug considerably. Furthermore, source/drain regions of the substrate may be damaged, and current will leak from the damaged source/drain regions of the substrate (junction leakage current). Obviously, a semiconductor device including a damaged substrate, damaged source/drain regions and a damaged conductive pattern will have poor electrical characteristics.

SUMMARY

Example embodiments provide a method of forming a spacer without damaging a substrate and/or sidewall of a pattern structure on which the spacer is formed.

Example embodiments provide a method of forming a spacer having precise dimensions.

Example embodiments provide a method of forming a contact plug having low contact resistance with conductive regions of a substrate.

Example embodiments provide a method of manufacturing a semiconductor device having excellent electrical characteristics.

According to one aspect of example embodiments, there is provided a method of forming a sidewall spacer using a sacrificial layer.

A pattern structure having a sidewall is formed on a substrate. A spacer formation layer is formed on the substrate over the pattern structure such that a portion of the spacer formation layer covers the sidewall. The sacrificial layer is formed on the spacer formation layer, and the sacrificial layer is anisotropically wet etched to form a sacrificial layer pattern on that portion of the spacer formation layer extending along the sidewall of the pattern structure. The spacer is formed on the sidewall of the pattern structure by etching the spacer formation layer using the sacrificial layer pattern as a mask.

The sacrificial layer may be formed of a luminescent material having an element in Group III. For example, the sacrificial layer may be made up of at least one film selected from the group consisting of gallium nitride, gallium aluminum nitride, and indium gallium nitride. In this case, the sacrificial layer may be treated with radiation, e.g., UV light, to enhance the wet etching thereof. The light may be directed substantially perpendicular to the substrate during the wet etching process. The etching solution employed by the wet etching process may comprise at least one of a potassium hydroxide solution, a sodium hydroxide solution, a hydrochloric acid solution, a phosphoric acid solution, and a sulfuric acid solution.

According to another aspect of example embodiments, there is provided a method of forming a sidewall spacer by wet etching a spacer formation layer using a sacrificial layer pattern as a mask.

A pattern structure having a sidewall is formed on a substrate. The spacer formation layer is formed on the substrate over the pattern structure such that a portion of the spacer formation layer covers the sidewall. A sacrificial layer pattern is formed on the portion of the spacer formation layer extending along the sidewall of the pattern structure. The spacer is formed on the sidewall of the pattern structure by wet etching the spacer formation layer using the sacrificial layer pattern as a mask.

The sacrificial layer pattern may be formed by forming a sacrificial layer on the spacer formation layer, and anisotropically etching the sacrificial layer. The sacrificial layer pattern may be formed at the same time that the spacer is being formed by, for example, using the same wet etching solution. For example, the wet etching solution may be a phosphoric acid solution.

Alternatively, the spacer formation layer and the sacrificial layer may have an etch selectivity with respect to a first wet etching solution, and the spacer may be formed on the sidewall of the pattern structure by soaking portions of the spacer formation layer exposed by the sacrificial layer pattern with the first wet etching solution. In this case, the sacrificial layer pattern may remain on the spacer after the spacer is formed. The sacrificial layer pattern may be subsequently removed by soaking the sacrificial layer pattern with a second wet etching solution having a composition different from that of the first wet etching solution.

According to another aspect of example embodiments, there is provided a method of manufacturing a semiconductor device which includes forming gates on a substrate, forming a spacer formation layer on the gates, forming a sacrificial layer on the spacer formation layer, wet etching the sacrificial layer to form a sacrificial layer pattern on the portions of the spacer formation layer extending along sidewalls of the gates, forming spacers on the sidewalls of the gates by etching the spacer formation layer using the sacrificial layer pattern as a mask, forming insulation layer which covers the spacers and the gates, and forming contact plugs extending through the insulation layer and into contact with regions of the substrate located between the gates.

The gates may be formed by first forming a gate insulation layer on the substrate, forming a gate conductive layer on the gate insulation layer, forming a gate mask on the gate conductive layer, and etching the gate conductive layer and the gate insulation layer using the gate mask as an etching mask. The gate conductive layer may include doped polysilicon, a metal and/or a metal compound.

Source/drain regions may be formed at portions of the substrate located between the gates.

BRIEF DESCRIPTION OF THE DRAWINGS

These and other features and aspects of example embodiments will become more apparent from the following detailed description, made with reference to the accompanying drawings, in which.

DETAILED DESCRIPTION OF THE EMBODIMENTS

Figure 1:
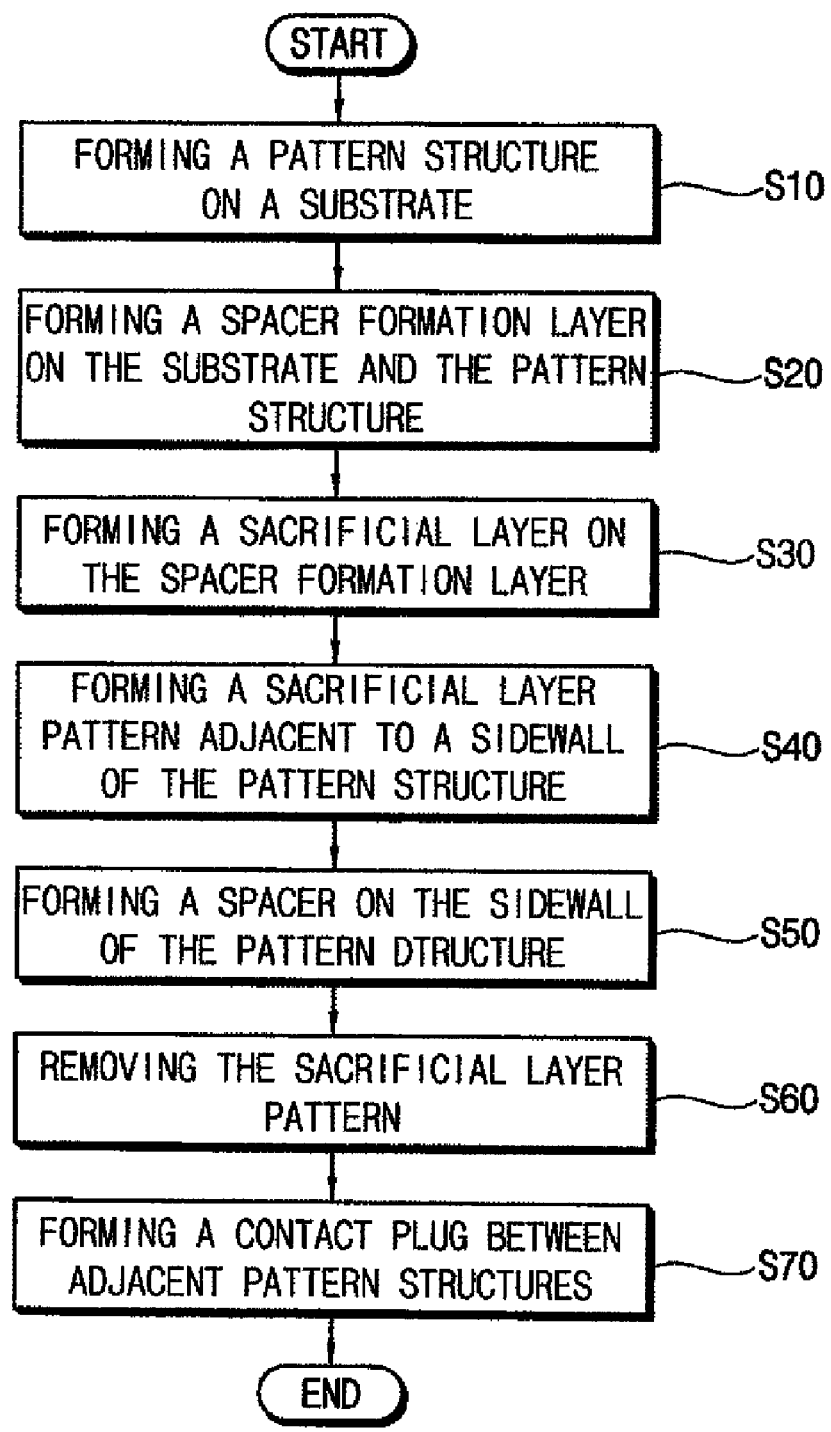
FIG. 1 is a flow chart illustrating a method of forming a spacer in accordance with example embodiments.

Example embodiments of the invention will be described more fully hereinafter with reference to the accompanying drawings. In the drawings, though, the sizes and relative sizes of layers and regions may be exaggerated for clarity. Likewise, the actual cross-sectional shapes of elements, layers, or regions may differ from those illustrated herein for ease in illustrating the invention and/or due to the vagaries of actual manufacturing processes. That is, the drawings are rather schematic in nature.

It will also be understood that when an element or layer is described as being "on," another element or layer, such a description encompasses both the case in which the element/layer is disposed directly on the other element as well as cases in which one or more elements or layers are present therebetween. Also, as used herein, the term "and/or" includes any and all combinations of one or more of the associated listed items.

Referring to FIG. 1, a pattern is formed on a substrate (step S10). The substrate may be a semiconductor substrate, namely, a silicon substrate, a germanium substrate, a silicon-germanium substrate or the like. Alternatively, the substrate may be a silicon-on-insulator (SOI) substrate, a germanium-on-insulator (GOI) substrate or the like. The pattern may be a conductive layer pattern, an insulation pattern, or a mask pattern. The substrate may have a contact region or an impurity region adjacent to the pattern. For example, the contact region or the impurity region may be located between adjacent features of the pattern.

A spacer formation layer is formed on the substrate and the pattern (step S20). The spacer formation layer may cover a sidewall and an upper surface of each feature of the pattern (referred to hereinafter as a "pattern structure"). The spacer formation layer is of a material that has an etch selectivity with respect to the material of the pattern and/or substrate. For example, the spacer formation layer may include at least one film of material selected from the group consisting of silicon nitride, silicon oxide, silicon carbon nitride, and silicon oxynitride.

A sacrificial layer is formed on the spacer formation layer (step S30). The sacrificial layer may be formed of a luminescent material that may be etched by a wet etchant and wherein the rate at which the material will be etched may be controlled by irradiating the luminescent material at the same time. For example, the sacrificial layer may include at least one film of a luminescent nitride wherein each film has an element in Group III. Such films include, for example, films of gallium nitride (GaNx), gallium aluminum nitride (GaAlxNy), and indium gallium nitride (InGaxNy).

The sacrificial layer is then etched (S40) by carrying out a wet etching process and irradiating the sacrificial layer, so that a sacrificial layer pattern is formed on the portion of the spacer formation layer extending along the sidewall of the pattern structure. The light may be directed onto the sacrificial layer along a direction substantially perpendicular to the substrate. The sacrificial layer pattern may serve as a mask for forming a spacer on the sidewall of the pattern structure, as will be described in more detail below.

In example embodiments, the sacrificial layer may be anisotropically etched. In this respect, the anisotropic etching process may be similar to that disclosed in "Highly anisotropic photoenhanced wet etching of N-type GaN", Appl. Phys. Lett., Vol. 71, No. 15, Oct. 13, 1997, the entirety of which is hereby incorporated by reference. In brief, a nitride film including an element in Group III may be anisotropically etched by subjecting the film to a wet etchant while irradiating the film with ultraviolet (UV) light. In example embodiments, the sacrificial layer may be anisotropically etched in this way so that the resulting sacrificial layer pattern covers only that portion of the spacer formation layer extending along a sidewall of the pattern structure.

Figure 2:
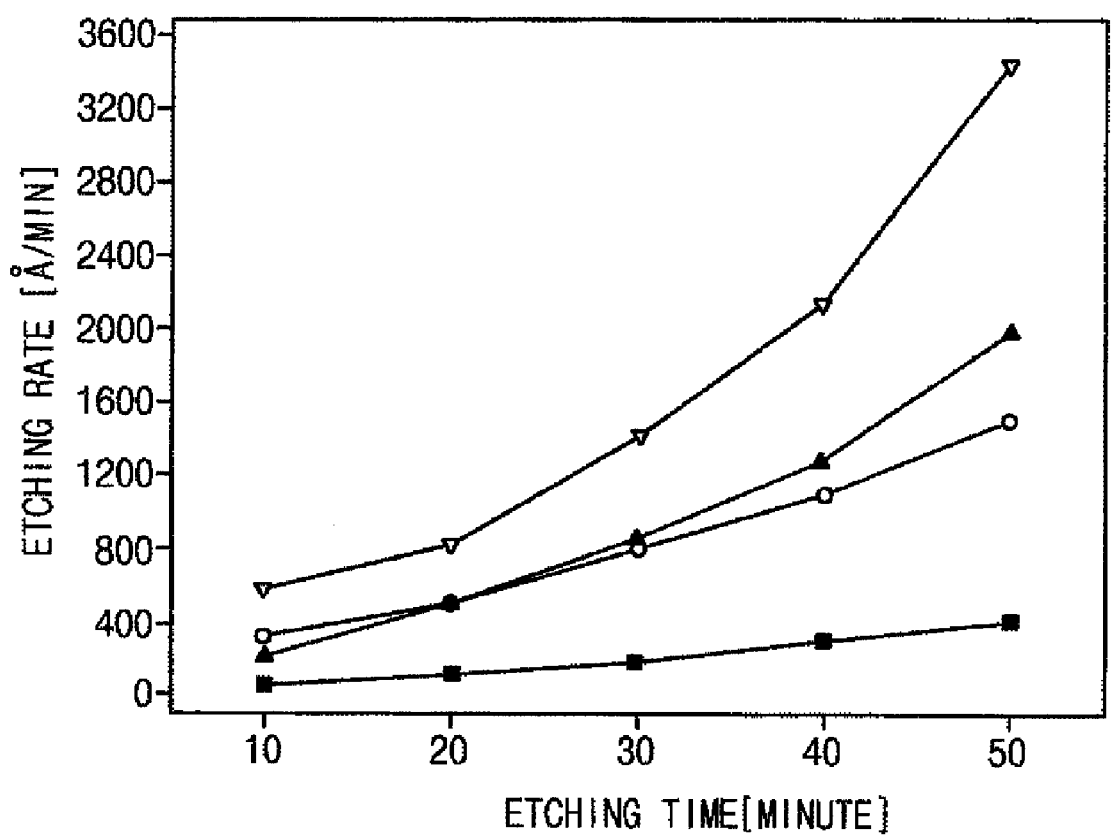
FIG. 2 is a graph illustrating etching rates over time of gallium nitride layers in the presence and absence of radiation.

FIG. 2 is a graph illustrating etching rates of gallium nitride layers. In FIG. 2, the points "■" on the graph show rates at which a gallium nitride layer is etched in a potassium hydroxide (KOH) solution without being irradiated (a first etching process), whereas the points "○" show rates at which a gallium nitride layer is etched in a potassium hydroxide solution while being irradiated (a second etching process). Furthermore, the points "▲" on the graph show rates at which a gallium nitride layer is etched in a phosphoric acid solution without being irradiated (a third etching process), and the points "▽" on the graph show rates at which a gallium nitride layer is etched in phosphoric acid solution while being irradiated (a fourth etching process).

As illustrated in FIG. 2, the etching rate, i.e., the rate at which a unit thickness of a gallium nitride film will be removed, does not substantially vary over time in the first etching process. However, the etching rate increases over time in the second etching process, i.e., with the addition of the light (radiation). Also, the etching rates of the third and fourth etching processes (employing phosphoric acid as the wet etchant) increase considerably over time. However, the etching rates of the third etching process is respectively lower than those of the fourth etching process. Thus, irradiating the gallium nitride layer may be used to control the rate of and thereby improve a wet etching of the gallium nitride layer.

Furthermore, as illustrated in FIG. 2, the etching rates of the fourth etching process (employing phosphoric acid as etching solution) is substantially greater than those of the second etching process (employing potassium hydroxide as etching solution), respectively. Therefore, according to the present invention, the sacrificial layer is etched using an etching solution including potassium hydroxide when the sacrificial layer is relatively thin. On the other hand, an etching solution including phosphoric acid is used to form the sacrificial layer pattern when the sacrificial layer is relatively thick. That is, the etching solution may be selected in accordance with the thickness of the sacrificial layer.

Referring once again to FIG. 1, the spacer formation layer is anisotropically etched using the sacrificial layer pattern as an etching mask, thereby forming a spacer on the sidewall of the pattern structure (step S50). In this respect, the spacer may be formed by a wet etching process to prevent the pattern structure and the substrate from being damaged.

The sacrificial layer pattern is removed from the spacer (step S60). When the sacrificial layer pattern includes a nitride, the sacrificial layer pattern may be removed using an etching solution including phosphoric acid because phosphoric acid will rapidly etch a nitride layer. In example embodiments, each of the spacer formation layer and the sacrificial layer pattern may include a nitride, and the spacer formation layer and the sacrificial layer pattern may be simultaneously etched, i.e., the sacrificial layer pattern may be removed as the spacer is being formed.

A plug is formed on the substrate between adjacent pattern structures (step S70). The plug may be formed of polysilicon doped with impurities, metal and/or a metal compound. The plug may be separated and thereby electrically isolated from the pattern structures by the spacer.

FIGS. 3 to 8 illustrate a method of manufacturing a semiconductor device in accordance with example embodiments.

Figure 3:
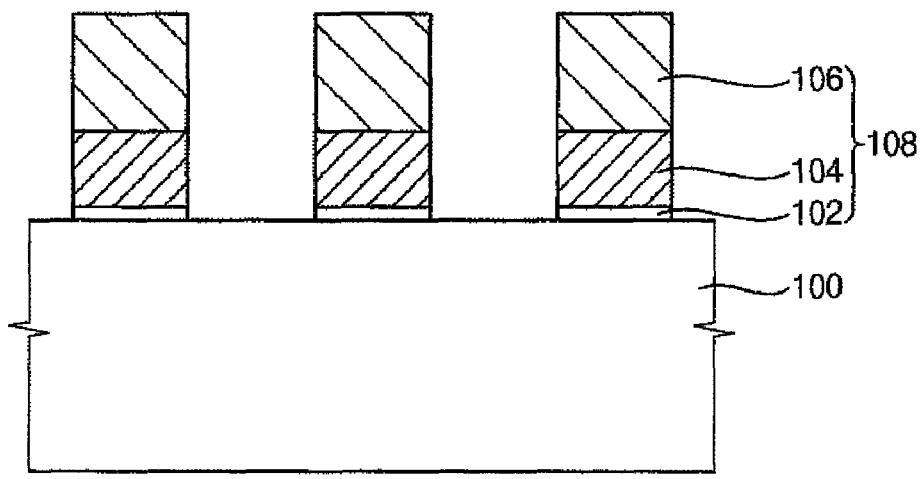
FIGS. 3 to 8 are each a cross-sectional view of a substrate and together illustrate a method of manufacturing a semiconductor device in accordance with example embodiments.

Referring to FIG. 3, gate structures 108 are formed on a substrate 100. The pitch of the gate structures 108 may be in a range of about 300 Å to about 2,000 Å. The substrate 100 may include an SOI substrate, a GOI substrate or a semiconductor substrate such as a silicon substrate, a germanium substrate, or a silicon-germanium substrate. Each of the gate structure 108 includes a gate insulation layer 102, a gate electrode 104 and a gate mask 106.

The gate insulation layer 102 may include an oxide layer selected from a group including metal oxides. For example, the gate insulation layer 102 may include a layer of silicon oxide (SiOx), hafnium oxide (HfOx), zirconium oxide (ZrOx), tantalum oxide (TaOx), or aluminum oxide (AlOx). The gate insulation layer 102 may be formed by a thermal oxidation process, a chemical vapor deposition (CVD) process, a sputtering process, or an atomic layer deposition (ALD) process. In example embodiments illustrated in FIGS. 3-8, the gate insulation layer 102 may be formed by a thermal oxidation process.

The gate electrode 104 may be formed of doped polysilicon, a metal and/or a metal compound. For example, the gate electrode 104 may be formed of at least one material selected from the group consisting of polysilicon doped with impurities, tungsten (W), tungsten nitride (WNx), tungsten silicide (WSix), aluminum (Al), aluminum nitride (AlNx), titanium (Ti), titanium nitride (TiNx), titanium silicide (TiSix), titanium aluminum nitride (TiAlxNy), tantalum (Ta), tantalum nitride (TaNx), tantalum silicide (TaSix), and cobalt silicide (CoSix). The gate electrode 104 may be formed by a sputtering process, plasma enhanced chemical vapor deposition (PECVD) process, a CVD process, an ALD process, a pulsed laser deposition (PLD) process, or an evaporation process. In example embodiments illustrated in FIGS. 3-8, the gate electrode 104 may have a multi-layered structure that includes a polysilicon film, a metal nitride layer, a metal silicide film and/or a metal film.

The gate mask 106 may be formed using a material having an etch selectivity relative to materials of the gate electrode 104 and the gate insulation layer pattern 102. For example, the gate mask 106 may be formed using a nitride such as silicon nitride, or an oxynitride such as silicon oxynitride or tantalum oxynitride.

In example embodiments, the gate electrode 104 and the gate insulation layer pattern 102 may be formed by patterning a gate conductive layer and gate insulation layer using the gate mask 106 as an etching mask. The gate mask 106, on the other hand, may be formed by a photolithography process, i.e., by forming a gate mask layer, forming a resist pattern on the gate mask layer, and then etching the gate mask layer using the resist pattern as an etching mask.

According to example embodiments illustrated in FIGS. 3-8, portions of the substrate 100 between adjacent gate structures 108 may be doped so those source/drain regions (not illustrated) are provided between the gate structures 108. In this respect, the source/drain regions may be formed in successive processes when the gate structures 108 are spaced by relatively small intervals.

Figure 4:
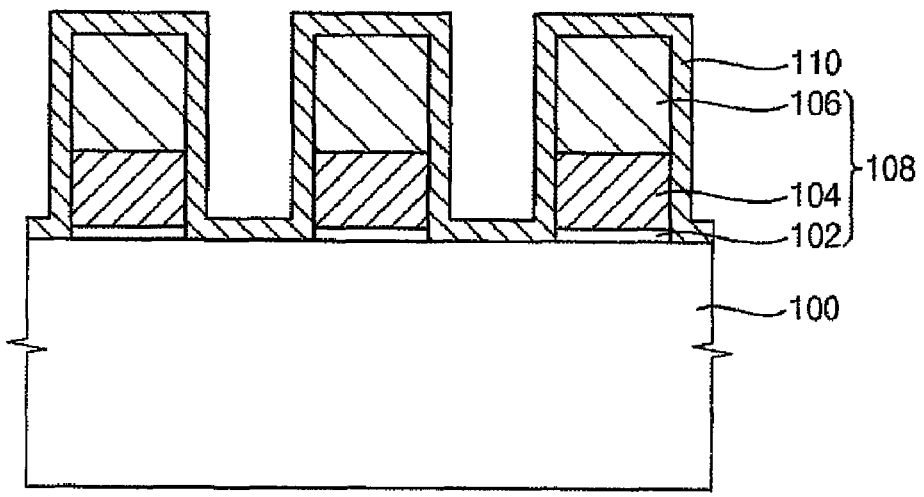
Figure 5:
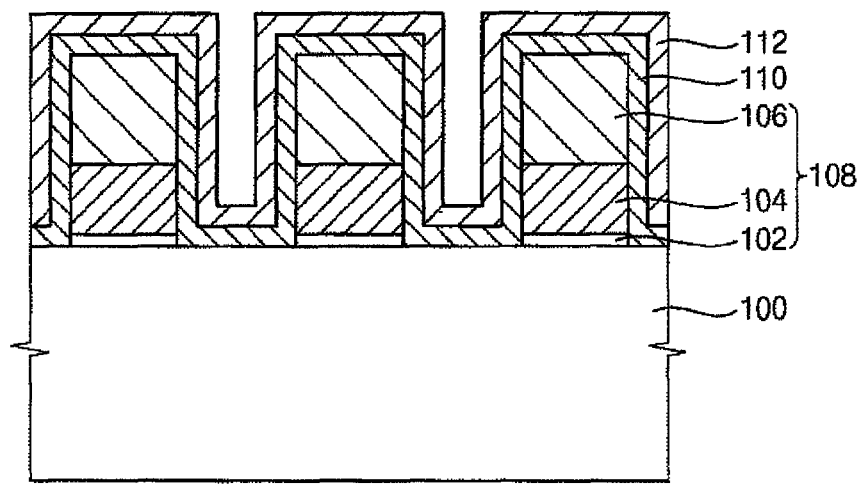

Referring to FIG. 4, a spacer formation layer 110 is formed on the substrate 100 to cover the gate structures 108. The spacer formation layer 110 may be a conformal layer, i.e., may extend continuously along sidewalls and upper surfaces of the gate structures 108 without filling in the gaps between the gate structures 108. The spacer formation layer 110 may be a nitride layer, an oxide layer and/or an oxynitride layer. For example, the spacer formation layer 110 may include at least one film of material selected from the group consisting of silicon nitride, silicon carbon nitride, silicon oxide, and silicon oxynitride. Furthermore, the spacer formation layer 110 may be formed by a CVD process, a PECVD process, an ALD process, or a sputtering process.

A sacrificial layer 112 (see FIG. 5) is formed on the spacer formation layer 110 including over portions of the spacer formation layer 110 extending along the sidewalls of the gate structures 108. The sacrificial layer 112 may be a conformal layer. For example, the sacrificial layer 112 may be formed on the spacer formation layer 110 without it filling the gaps between the gate structures 108. Also, in this respect, the spacer formation layer 110 may be formed so as to leave a gap, between adjacent gate structures 108, that is wide enough to ensure that the sacrificial layer 112 may be formed as desired.

The sacrificial layer 112 may be formed of a luminescent material including an element in Group III. For example, the sacrificial layer 112 may include at least one film of a nitride selected from the group consisting of gallium nitride (GaNx), gallium aluminum nitride (GaAlxNy), and indium gallium nitride (InGaxNy). Furthermore, the sacrificial layer 112 may be formed by an ALD process, a CVD process, a metal organic chemical vapor deposition (MOCVD) process, or a molecular beam epitaxial process. Also, a nucleation layer (not illustrated) may be formed on the spacer formation layer 110 before the sacrificial layer 112 is formed. The nucleation layer may be produced by thermally treating a nitride layer in an oxygen rich atmosphere. Such a nucleation layer may facilitate the forming of the sacrificial layer 112.

Figure 6:
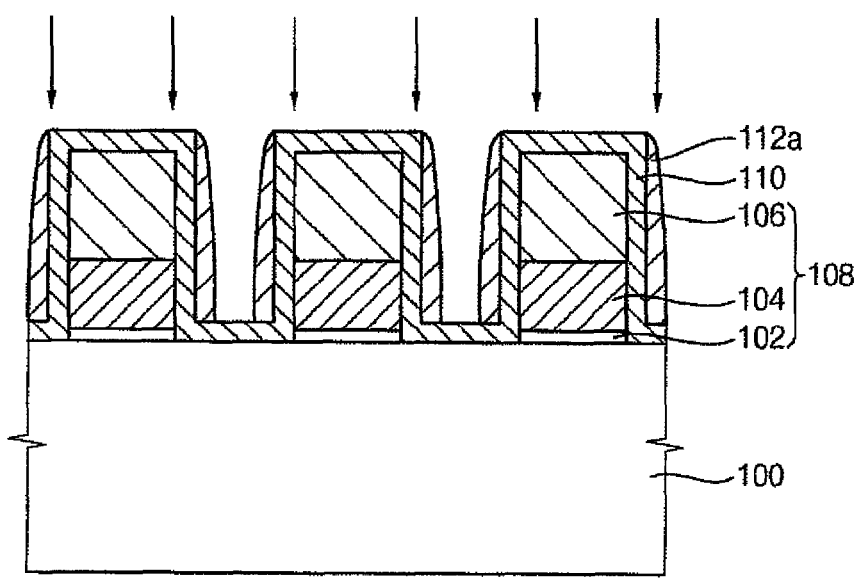

Referring to FIG. 6, the sacrificial layer 112 is etched to form a sacrificial layer pattern 112a on those portions of the spacer formation layer 110 which extend along the sidewalls of the gate structures 108. For example, the sacrificial layer 112 may be anisotropically etched by treating the sacrificial layer 112 with radiation (irradiating the sacrificial layer) and soaking the sacrificial layer 112 in a wet etching solution. That is, the sacrificial layer pattern 112a may be formed by a photo-enhanced wet etching process.

In such a photo-enhanced wet etching process, the portions of the sacrificial layer 112 exposed to the light may be etched more rapidly than the other portions of the sacrificial layer 112. The light used in the photo-enhanced etching process may free electrons and may create holes in the portions of the sacrificial layer 112 which are irradiated, when the light has an energy substantially equal to or substantially larger tan band gap energy of the sacrificial layer 112. Portions of the sacrificial layer 112 in which the holes are produced may be etched more rapidly than portions of the sacrificial layer 112 which do not have such holes, due to the fact that the portions of the sacrificial layer having the holes present a larger surface area to the wet etching solution.

The light used to irradiate the sacrificial layer 112 and thereby enhance the wet etching of the sacrificial layer may be emitted so as to propagate perpendicularly to the substrate 100. In this case, the portions of the sacrificial layer 112 which lie along the upper surfaces of the gate structures 108 and which extend between the gates structures 108 parallel to the substrate 100 may be irradiated to a greater extent and may be etched more rapidly than the portions of the sacrificial layer which extend along the sidewalls of the gate structures 108. Thus, the sacrificial layer pattern 112a formed as a result may cover only the sidewalls of the gate structures 108.

The wet etchant employed in forming the sacrificial layer pattern 112a may include at least one solution selected from among the group consisting of potassium hydroxide (KOH), sodium hydroxide (NaOH), phosphoric acid ($H_3PO_4$), hydrochloric acid (HF), and sulfuric acid ($H_2SO_4$). When, as described above, the sacrificial layer 112 includes a nitride film having an element in Group III, the rate at which the sacrificial layer 112 is wet etched may be controlled by exposing the sacrificial layer to such a solution and irradiating the sacrificial layer 112 with ultraviolet (UV) light or with light having a wavelength substantially the same as that of UV light. To this end, the substrate 100 having the sacrificial layer 112 may be immersed in the etching solution while it is irradiated.

The sacrificial layer 112 from which the sacrificial layer pattern 112a is fashioned has a thickness substantially the same or substantially similar to that of the spacer formation layer 110. The sacrificial layer 112 may have a thickness of about 10 Å to about 500 Å. If the thickness of the sacrificial layer 112 is less than about 10 Å, the sacrificial layer pattern 112a may be defective. On the other hand, if the thickness of the sacrificial layer 110 is greater than about 500 Å, it may be difficult to remove the resulting sacrificial layer pattern 112a from the sidewalls of the gate structures 108 (which process is carried out subsequently as described below).

Figure 7:
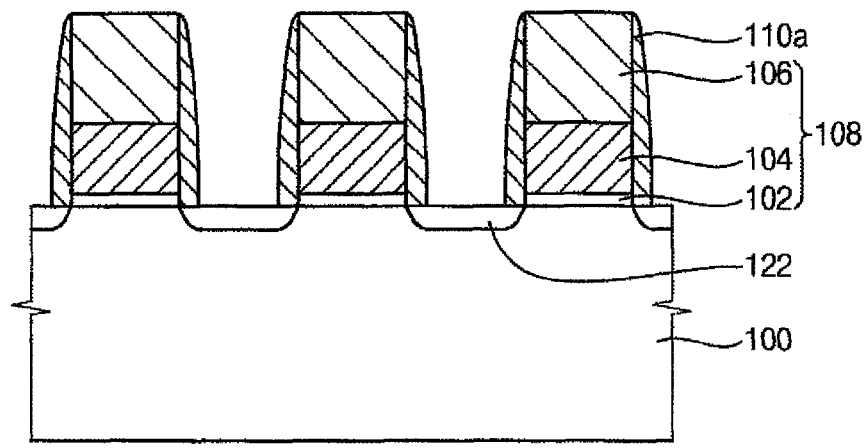

Referring to FIG. 7, the spacer formation layer 110 is etched using the sacrificial layer pattern 112a as an etching mask, so that spacers 110a are formed on the sidewalls of the gate structures 108. The spacers 110a may be formed by a wet etching process to prevent the gate structures 108 and the substrate 100 from being damaged. The etching process may be carried out using a first etching solution of, for example, hydrofluoric acid or phosphoric acid. The wet etching of the spacer formation layer 110 may obviate the need for an additional cleaning process.

The sacrificial layer pattern 112a may be removed from the spacers 110a by a wet etching process using a second etching solution. The second etching solution may include at least one solution selected from the group consisting of potassium hydroxide, sodium hydroxide, hydrochloric acid, phosphoric acid, and sulfuric acid. Also, the first etching solution employed for forming the spacer formation layer 110 may be the same as or substantially similar to the second etching solution employed for forming the sacrificial layer pattern 112a. For example, the first and the second etching solutions may both include a solution of phosphoric acid. This may be advantageous when the sacrificial layer pattern 112a includes a nitride layer comprising an element in Group III and the spacer formation layer 110 also includes a nitride layer. In such a case, the sacrificial layer pattern 112a may be removed while the spacer formation layer 110 is being etched, i.e., while the spacers 110a are being formed. Also, the sacrificial layer pattern 112a may be irradiated to enhance the etching process.

Referring now to FIG. 7, the portions of the substrate 100 between adjacent spacers 110 are doped with impurities to form source/drain regions 122 between adjacent gate structures 108. The impurities may be implanted into the substrate 110 using the spacers 110a and the gate structures 108 as implantation masks.

An etch stop layer (not illustrated) may be formed on the substrate 100 over the spacers 110a and the gate structures 108. The etch stop layer may include a nitride layer such as a layer of silicon nitride. Furthermore, the etch stop layer may be formed by a CVD process, a PECVD process, or an ALD process.

Figure 8:
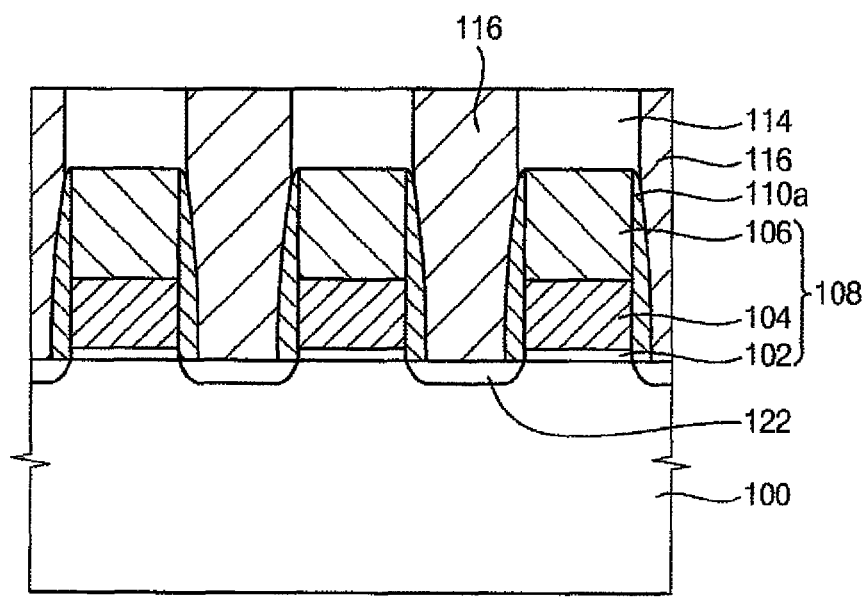

Referring to FIG. 8, an insulation layer 114 is formed on the substrate 100 over the gate structures 108 and the spacers 110a (and the etch stop layer when so formed). The insulation layer 114 may be formed of at least one layer of material selected from the group consisting of undoped silicate glass (USG), spin on glass (SOG), boro silicate glass (BSG), phosphor silicate glass (PSG), boro-phosphor silicate glass (BPSG), flowable oxide (FOX), tonen silazene (TOSZ), tetraethyl orthosilicate (TEOS), plasma enhanced-tetraethyl orthosilicate (PE-TEOS), and high density plasma-chemical vapor deposition (HDP-CVD) oxide. In example embodiments, the insulation layer 114 may be an oxide layer such as a layer of silicon oxide.

The insulation layer 114 may be formed by a CVD process, a spin coating process, a PECVD process, an HDP-CVD process, or an ALD process. As necessary, the insulation layer 114 may be subsequently planarized by a chemical mechanical polishing (CMP) process and/or an etch-back process.

A mask pattern (not illustrated) is formed on the insulation layer 114. The mask pattern may be a patterned layer of photoresist, silicon nitride, or silicon oxynitride. The insulation layer 114 is etched, using the mask pattern as an etching mask, until the source/drain regions 122 are exposed. The etch stop layer, if provided as described above, may protect the gate structures 108 and the substrate 100. The etch stop layer may also be used as a means to effectively terminate the etching process. In any case, the etching of the insulation layer 114 forms contact holes which extend through the insulation layer 114 and expose the source/drain regions 122. In this process, the spacers 110a may not be etched because they are of material have an etching selectivity with respect to that of the insulation layer 114. The contact holes are thus aligned by the spacers 110a with the source/drain regions 112. Thus, the contact holes are formed by what is referred to as a self alignment process.

Still referring to FIG. 8, a conductive layer (not illustrated) is formed on the insulation layer 114 to such a thickness as to fill the contact holes. The conductive layer may include doped polysilicon, a metal and/or a metal compound. For example, the conductive layer may include at least one film of material selected from the group consisting of polysilicon doped with impurities, tungsten, aluminum, titanium or tantalum, tungsten nitride, titanium nitride, aluminum nitride, titanium aluminum nitride, and tantalum nitride. Furthermore, the conductive layer may be formed by a sputtering process, a CVD process, a PECVD process, an ALD process, a PLD process, or an evaporation process.

The conductive layer is planarized until the insulation layer 114 is exposed, so that the remaining portion of the conductive layer forms plugs 116 which fill the contact holes and extend on the source/drain regions 122, respectively. The planarizing of the conductive layer to form the plugs 116 may be a CMP process and/or an etch-back process. The plugs 116 may be referred to as self aligned contact (SAC) plugs because the contact holes are formed by a self alignment process.

Also, the spacer formation layer 110 is formed to a thickness of about 10 Å to about 500 Å considering the dimensions of the spacers 110a and the plugs 116. If the spacer formation layer 110 has a thickness of less than about 10 Å, the spacers 110a (see FIG. 7) may be improperly formed on the sidewalls of the gate structures 108. On the other hand, if the spacer formation layer 110 has a thickness greater than about 500 Å, the plugs 116 may be correspondingly narrow and as such, the area of contact between plugs 116 and the substrate 100 may be insufficient.

According to example embodiments, the plugs 116 may have relatively low contact resistances because the substrate 100 and the source/drain regions 122 may not be damaged while the spacers 110a are formed. Furthermore, the breakdown voltages between the spacers 110a and the gate structures 108 may be improved because the spacers 110a are well-formed on the sidewalls of the gate structures 108 and may be formed without damaging the gate structures 108. Therefore, a semiconductor device including the spacers 110a, the gate structures 108 and the plugs 116 may have excellent electrical characteristics and a high degree of integration.

FIGS. 9 to 13 illustrate a method of manufacturing a semiconductor device in accordance with example embodiments. This method may be substantially similar to that described with reference to FIGS. 3 to 8 except for the forming of the spacers.

Figure 9:
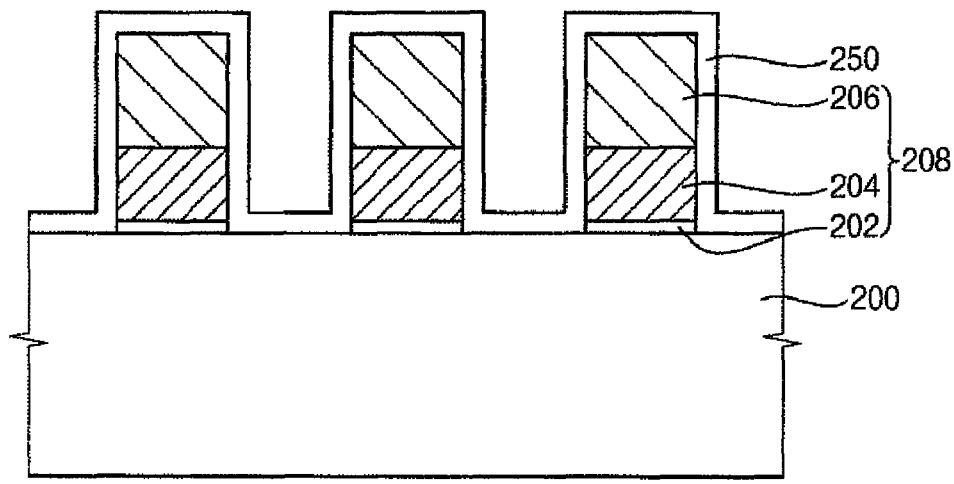
FIGS. 9 to 13 are each a cross-sectional view of a substrate and together illustrate a method of manufacturing the semiconductor device in accordance with example embodiments.

Referring to FIG. 9, a gate insulation layer (not illustrated) and a gate conductive layer (not illustrated) are formed on a substrate 200, and a gate mask 206 is formed on the gate conductive layer. The substrate 200 may be a semiconductor substrate, an SOI substrate, or a GOI substrate. An isolation layer (not illustrated) may be formed at the upper portion of the substrate 200 to define active regions and isolation regions of the substrate 200.

The gate insulation layer may be formed using silicon oxide, hafnium oxide, zirconium oxide, tantalum oxide, or aluminum oxide. Furthermore, the gate insulation layer may be formed by a thermal oxidation process, a CVD process, a sputtering process, or an ALD process. The gate conductive layer may include at least one film of material selected from the group consisting of polysilicon doped with impurities, tungsten, tungsten nitride, tungsten silicide, aluminum, aluminum nitride, titanium, titanium nitride, titanium silicide, titanium aluminum nitride, tantalum, tantalum nitride, tantalum silicide, and cobalt silicide. Also, the gate conductive layer may be formed by a sputtering process, a PECVD process, a CVD process, an ALD process, a PLD process, or an evaporation process. The gate mask 206 may be a patterned layer of silicon nitride, silicon oxynitride or tantalum oxynitride, wherein the layer may be formed by a CVD process, an ALD process, or a PECVD process.

The gate conductive layer and the gate insulation layer are etched, using the gate mask 206 as an etching mask, to form gate electrodes 204 and gate insulation layers 202 on the substrate 200. The gate insulation layers 202, the gate electrodes 204 and respective segments of the gate mask 206 constitute gate structures 208. For example, the pitch of the gate structures 208 may be in a range of about 300 Å to about 2,000 Å.

A spacer formation layer 250 is formed on the substrate 200 over the gate structures 208. The spacer formation layer 250 may be formed using material that has a dielectric constant substantially lower than the of silicon nitride. For example, the spacer formation layer 250 may be formed using an oxide. In example embodiments, the spacer formation layer 250 may be formed using silicon oxide to reduce the parasitic capacitance between fie spacers 250a and the gate structures 208 (the spacers 250 being formed from the spacer formation layer 250 as will be described with respect to FIGS. 11 and 12). Furthermore, the spacer formation layer 250 may be formed by a CVD process, a thermal oxidation process, a PECVD process, or an HDP-CVD process.

The spacer formation layer 250 may be a conformal layer that extends contiguously along the substrate 200, sidewalls of the gate structures 208 and upper surfaces of the gate structures 208, i.e., conforms to the topography of the gate structures 208 and the substrate 200 between the gate structures 208. Thus, the spacer formation layer 250 may not fill in the gaps between the gate structures 208. The spacer formation layer 250 may have a thickness in a range of about 10 Å to about 500 Å.

Figure 10:
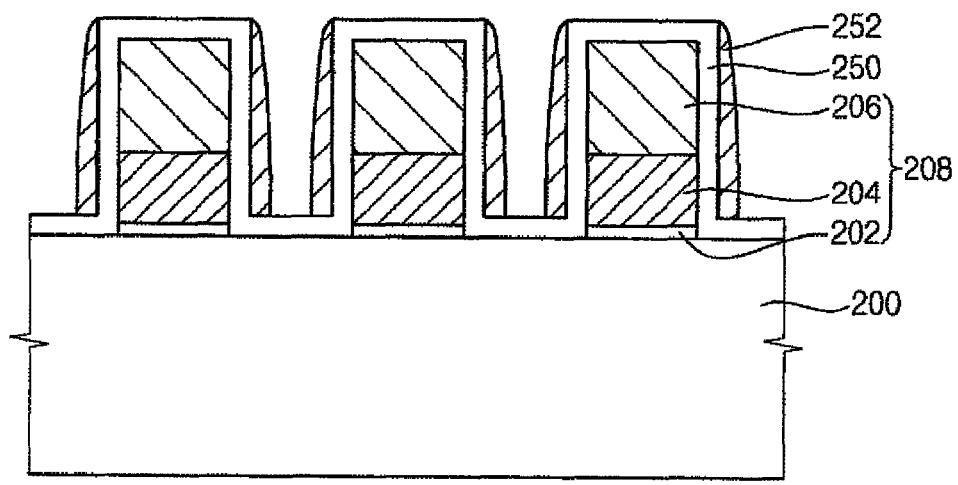

Referring to FIG. 10, a sacrificial layer is formed on the spacer formation layer 250 and is etched to form a sacrificial layer pattern 252. The sacrificial layer may be formed by a CVD process, an ALD process, a sputtering process, or a PECVD process. Also, the sacrificial layer may be formed using a luminescent material that includes an element in Group III. For example, the sacrificial layer may include a layer of gallium nitride, gallium aluminum nitride, or indium gallium nitride. Thus, the etching rate of the sacrificial layer may be controlled by wet etching the sacrificial layer and irradiating the sacrificial layer. The sacrificial layer may be etched using a photo-enhanced wet etching process as described in connection with embodiments illustrated in FIGS. 3-8.

Figure 11:
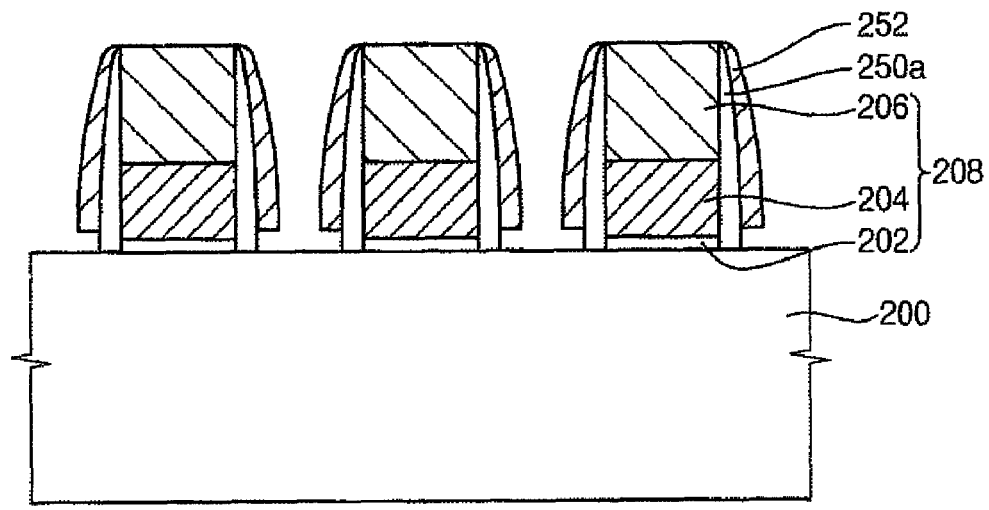

Referring to FIG. 11, the spacer formation layer 250 is wet etched using the sacrificial layer pattern 252 as an etching mask to thereby form spacers 250a on the sidewalls of the gate structures 208. For example, the spacer formation layer 250 may be etched using an etching solution that includes hydrofluoric acid to form the spacers 250a. The sacrificial layer pattern 252 remains on the spacers 250a because the sacrificial layer pattern 252 may has an etch resistance with respect to hydrofluoric acid. As a result, the spacer formation layer 250 is etched away from beneath the sacrificial layer pattern 252 such that the sacrificial layer pattern 252 is spaced from the substrate 200 by an amount corresponding to the thickness of the spacer formation layer 250. Thus, lower portions of the spacers 250a beneath the sacrificial layer pattern 252 is exposed.

Figure 12:
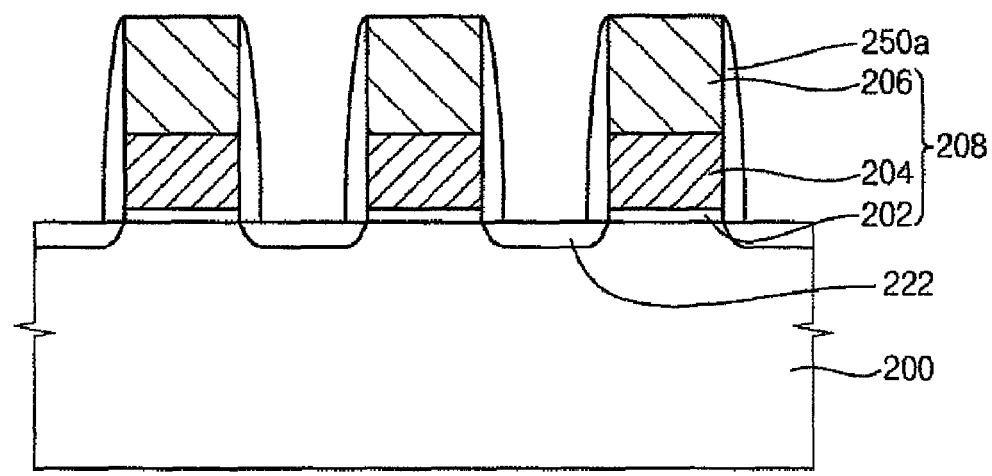

Referring to FIG. 12, the sacrificial layer pattern 252 is removed from the spacers 250a. In this respect, the sacrificial layer pattern 252 may be wet etched using, for example, a potassium hydroxide solution, a sodium hydroxide solution, a phosphoric acid solution, or a sulfuric acid solution. In some applications of example embodiments, though, the sacrificial layer pattern 252 may be left on the spacers 250a.

Portions of the substrate 200 between the gate structures 208 are doped with impurities using the gate structures 208 and the spacers 250a as implantation masks. Hence, source/drain regions 222 are formed at the portions of the substrate 200 between the gate structures 208. The spacers 250a may establish the extent to which the source/drain regions 222 extend laterally along the substrate, i.e., in the direction between adjacent gate structures 208.

An etch stop layer may be subsequently formed on the substrate 200 so as to extend over the source/drain regions 222, the spacers 220 and the gate mask 206. The etch stop layer may be formed of silicon nitride or silicon oxynitride by a CVD process, a PECVD process, or an ALD process.

Figure 13:
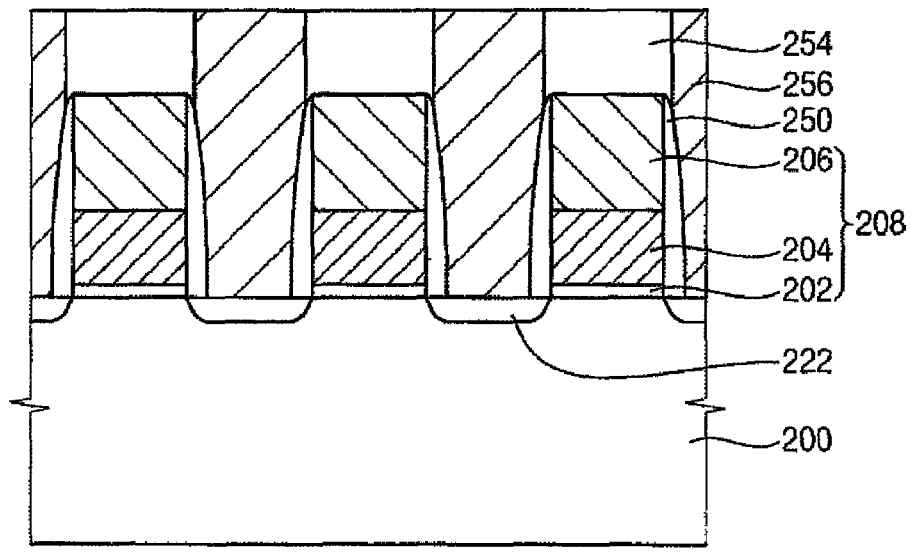

Referring to FIG. 13, an insulation layer 254 is formed on the substrate 200 to such a thickness as to cover the gate structures 208 and the spacers 250a and fill the gaps between the gate structures 208. The insulation layer 254 may have a flat upper surface. The insulation layer 254 may be formed using silicon oxide. For example, the insulation layer 254 may include an SOG, USG, PSG, BSG, BPSG, FOX, TOSZ, TEOS, PE-TEOS, or HDP-CVD oxide layer. Furthermore, the insulation layer 254 may be formed by a CVD process, an ALD process, a PECVD process, or an HDP-CVD process. Depending on the material of the insulation layer 254, an upper portion of the insulation layer 254 may be planarized by a CMP process and/or an etch-back process to provide a flat upper surface.

A mask (not illustrated) is formed on the insulation layer 254. The mask may be a patterned layer of photoresist, silicon nitride, or silicon oxynitride. The insulation layer 254 is etched using the mask to form the contact holes exposing the source/drain regions 222, respectively. The etching process for forming the contact holes through the insulation layer 254 may be precisely controlled when the spacer formation layer 250 is formed of oxide. Moreover, the etch stop layer mentioned above may serve as a means to terminate the etching of the insulation layer 254. Such an etch stop layer may also protect the source/drain regions 222 and the spacers 250a from being damaged while the contact holes are being formed.

A conductive layer (not illustrated) is formed on the exposed source/drain regions 222 and the insulation layer 254 to such a thickness as to fill the contact holes. The conductive layer may include polysilicon doped with impurities, tungsten, aluminum, titanium, tantalum, tungsten nitride, titanium nitride, aluminum nitride, titanium aluminum nitride, or tantalum nitride. Furthermore, the conductive layer may be formed by a sputtering process, a CVD process, a PECVD process, an ALD process, a PLD process, or an evaporation process.

The conductive layer is planarized by a CMP process and/or an etch-back process) until the insulation layer 254 is exposed and plugs 256 of the conductive layer remains in the contact holes. Each of the plugs 256 contacts a respective one of the source/drain regions 222.

According to example embodiments as described above, the parasitic capacitance between the plugs 256 and the gate structures 208 may be relatively low because the spacers 250a are formed of an oxide. Furthermore, the contact resistances of the plugs 256 may be relatively low because the substrate 200 and the source/drain regions 222 are not damaged while the spacers 250a are formed FIGS. 14 to 18 illustrate a method of manufacturing a plug in accordance with example embodiments.

Figure 14:
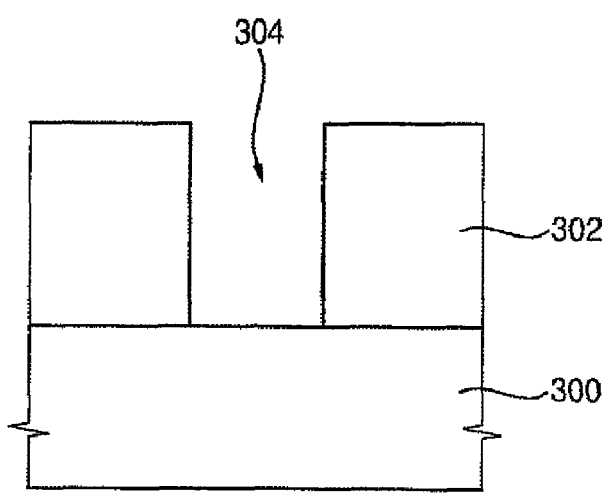
FIGS. 14 to 18 are each a cross-sectional view of a substrate and together illustrate a method of manufacturing a contact plug in accordance with example embodiments.

Referring to FIG. 14, an insulation interlayer 302 is formed on a substrate 200. The substrate 300 may be a semiconductor substrate, an SOI substrate, or a GOI substrate. The insulation interlayer 302 may include an oxide layer such as a layer of silicon oxide. For example, the insulation interlayer 302 may be a USC, SOG, FOX, TOSZ, PSQ BPSC, TEOS, PE-TEOS, or HDP-CVD oxide layer. Furthermore, the insulation interlayer 302 may be formed by a CVD process, a PECVD process, an HDP-CVD process, or a spin coating process. Although not illustrated, other structures or regions may exist on or at the upper surface of the substrate 300. Examples of such structures/regions are pads, plugs, contact regions, impurity regions, conductive patterns, insulation patterns and transistors. Such structures/regions may be covered by the insulation interlayer 302 and hence, will be referred to as "underlying" structures/regions.

A mask (not illustrated), e.g., a patterned layer of photoresist, is formed on the insulation interlayer 302, and the insulation interlayer 302 is etched to form a contact whole 304 through the insulation interlayer 302. The contact hole 304 may expose a portion of the substrate 300, for example, an underlying contact region or impurity region. Alternatively, the contact hole 304 may expose an underlying conductive pattern. The insulation interlayer 302 may be etched by an anisotropic etching process so that sides of the contact hole 304 extend substantially perpendicular to the substrate 300. After the contact hole 304 is formed, the mask may be removed from the insulation interlayer 302. In the case in which the mask is a patterned photoresist layer, the mask may be removed by an ashing process and/or a stripping process.

Figure 15:
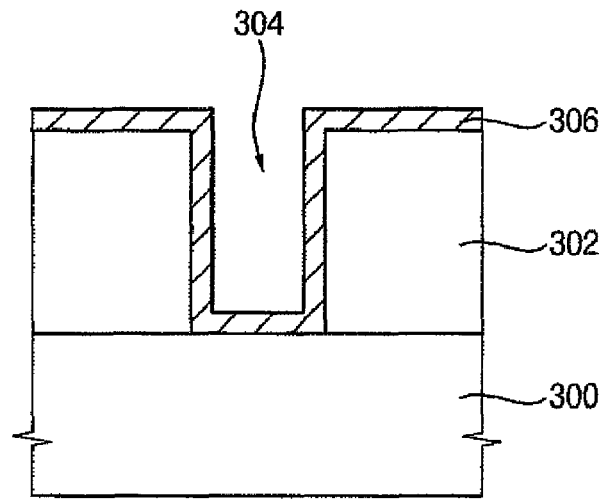

Referring to FIG. 15, a spacer formation layer 306 is formed on the insulation interlayer 302 so as to extend along the sides and bottom of the contact hole 304. The spacer formation layer 306 may include at least one film of material selected from the group consisting of silicon oxide, silicon nitride, silicon carbon nitride, and silicon oxynitride. For example, the spacer formation layer 306 may be formed using a material substantially different from that of the insulation interlayer 302 so as to have an etching selectivity with respect to the insulation interlayer 302.

Furthermore, the spacer formation layer 306 may be formed by a CVD process, a PECVD process, an ALD process, or an HDP-CVD process. The spacer formation layer 306 may ensure that the dimensions of the contact hole 302 are maintained during subsequent cleaning processes. The spacer formation layer 306 may be formed so as to be conformal at least with respect the bottom and the sides of the contact whole 304. In other words, the spacer formation layer 306 may have a uniform thickness along both the bottom and sides of the contact hole 304.

The spacer formation layer 306 may have a thickness in a range of about 10 Å to about 500 Å. If the thickness of the spacer formation layer 306 is below about 10 Å, subsequent cleaning processes may damage the spacer formation layer 306 to such an extent that the spacer formation layer 306 may not adequately properly protect the insulation interlayer 302. On the other hand, if the thickness of the spacer formation layer 306 is above about 500 Å, a plug 310 formed in the contact hole 304 (refer to FIG. 18 and the description thereof)

may be too narrow and thereby have an undesirably high contact resistance with respect to the underlying region/structure.

Figure 16:
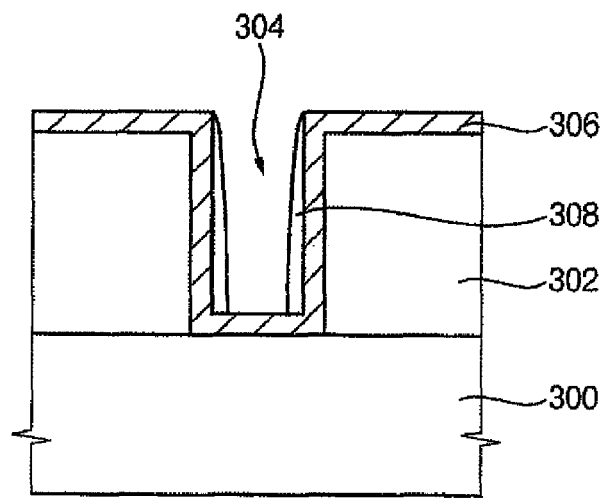

Referring to FIG. 16, a sacrificial layer (not illustrated) is formed on the spacer formation layer 306. The sacrificial layer is etched to form a sacrificial layer pattern 308 on those portions of the spacer formation layer 306 extending along the sides of the contact hole 304. The sacrificial layer may be formed by a CVD process, an ALD process, a sputtering process, or a PECVD process. Also, the sacrificial layer may be formed of a luminescent material that includes an element in Group III. For example, the sacrificial layer may include a layer of gallium nitride, gallium aluminum nitride, or indium gallium nitride. Thus, the etching rate of the sacrificial layer may be controlled by wet etching the sacrificial layer and irradiating the sacrificial layer. The sacrificial layer may be etched using a photo-enhanced wet etching process as described in connection with embodiments illustrated in FIGS. 3-8.

Figure 17:
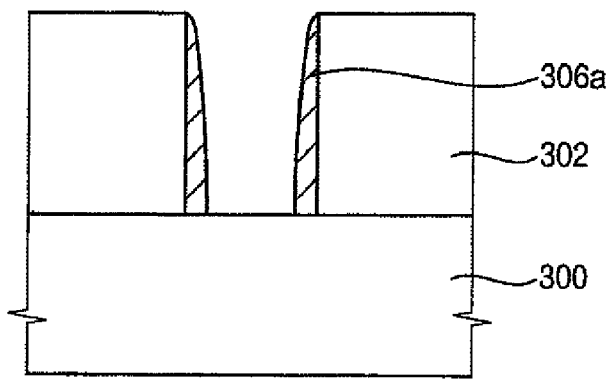

Referring to FIG. 17, the spacer formation layer 306 is etched using the sacrificial layer pattern 308 as etching mask. As a result, a spacer 306a is formed on a sidewall of the insulation interlayer 302 which defines the sides of the contact hole 304. The spacer formation layer 306 may be etched by a wet etching process using an etching solution so that the substrate 300 and/or the underlying structure may not be damaged. Furthermore, the wet etching process may obviate the need for an additional cleaning process.

The sacrificial layer pattern 308 may be removed while the spacer 306a is being formed when the spacer formation layer 306 includes silicon nitride. For example, the spacer formation layer 306 and the sacrificial layer pattern 308 may be simultaneously wet etched using a solution of phosphoric acid when the spacer formation layer 306 is of silicon nitride and the sacrificial layer pattern 308 is of a nitride having an element in Group III. Alternatively, the sacrificial layer pattern 308 may be removed from the spacer 306a after the spacer 306a is formed, e.g., when the spacer formation layer 306 is of silicon oxide. In this case, the sacrificial layer pattern 308 and the spacer formation layer 306 may be etched by a first wet etching process and a second wet etching process, respectively. The first wet etching process may employ a first etching solution including hydrofluoric acid and the second etching process may employ a solution of potassium hydroxide, sodium hydroxide, phosphoric acid, or sulfuric acid. In either case, the width of the contact hole 304 remains unchanged and the substrate 300 and the underlying structure may not be damaged.

Figure 18:
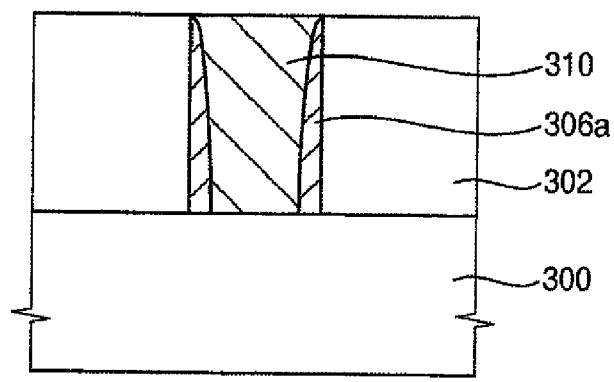

Referring to FIG. 18, a conductive layer (not illustrated) is formed on the insulation interlayer 302 to such a thickness as to fill the contact hole 304. Thus, the conductive layer may reside on the contact region or the impurity region of the substrate 300. The conductive layer may include at least one material selected from the group consisting of polysilicon doped with impurities, tungsten, aluminum, titanium, tantalum, tungsten nitride, titanium nitride, aluminum nitride, titanium aluminum nitride, and tantalum nitride. Furthermore, the conductive layer may be formed by a sputtering process, a CVD process, a PECVD process, an ALD process, a PLD process, or an evaporation process.

The conductive layer is planarized until the insulation interlayer 302 is exposed, thereby leaving a plug 310 of the conductive material in the contact hole 304. The planarization process used to form the plug 310 may be a CMP process and/or an etch-back process.

The foregoing description of example embodiments is illustrative of the invention and is not to be construed as limiting. For example, the invention has been described in connection with the forming of a self aligned contact or an insulating interlayer contact. However, the method of the invention may be used in various other ways in connection with the manufacturing of semiconductor devices, such as in the forming of a protection layer on a sidewall of a contact or the forming of source/drain regions per se. Moreover, changes to and modifications of example embodiments will become apparent to those skilled in the art. Accordingly, changes to and modifications of example embodiments may be within the true spirit and scope of the invention as defined by the following claims.

What is claimed is:

1. A method of forming a spacer, comprising:
   forming on a substrate a pattern structure having a sidewall which is substantially upright with respect to the substrate;
   forming a spacer formation layer over the pattern structure such that a portion of the spacer formation layer extends along the sidewall of the pattern structure;
   forming a sacrificial layer on the spacer formation layer;
   forming a sacrificial layer pattern covering the portion of the spacer formation layer which extends along the sidewall of the pattern structure, wherein the forming of the sacrificial layer pattern comprises anisotropically etching the sacrificial layer using a wet etching solution; and
   forming a spacer on the sidewall of the pattern structure by etching the spacer formation layer using the sacrificial layer pattern as a mask,
   wherein the forming of the sacrificial layer comprises forming a layer of luminescent material having an element in Group III on the spacer formation layer, and the forming of the sacrificial layer pattern further comprises treating the sacrificial layer with radiation.

2. The method of claim 1, wherein the sacrificial layer includes at least one film of material selected from the group consisting of gallium nitride, gallium aluminum nitride and indium gallium nitride.

3. The method of claim 1, wherein the forming of the sacrificial layer pattern comprises directing the radiation so as to propagate onto the sacrificial layer along a direction substantially perpendicular to the substrate while the sacrificial layer is being soaked with the wet etching solution.

4. The method of claim 3, wherein the wet etching solution comprises a solution selected from the group consisting of a potassium hydroxide solution, a sodium hydroxide solution, a hydrochloric acid solution, a phosphoric acid solution and a sulfuric acid solution.

5. The method of claim 1, wherein the radiation is ultraviolet light.

6. A method of forming a spacer, comprising:
   forming on a substrate a pattern structure having a sidewall which is substantially upright with respect to the substrate;
   forming a spacer formation layer over the pattern structure such that a portion of the spacer formation layer extends along the sidewall of the pattern structure;
   forming a sacrificial layer pattern covering the portion of the spacer formation layer which extends along the sidewall of the pattern structure; and
   forming a spacer on the sidewall of the pattern structure by soaking portions of the spacer formation layer exposed by the sacrificial layer pattern with a wet etching solution,
   wherein the forming of the sacrificial layer pattern comprises forming a sacrificial layer over the spacer formation layer, and anisotropically etching the sacrificial layer with a wet etching solution, and wherein the forming of the spacer on the sidewall of the pattern structure comprises soaking portions of the spacer formation layer exposed by the sacrificial layer pattern with a first wet etching solution, and material of the spacer formation layer and material of the sacrificial layer have an etch selectivity with respect to the first wet etching solution such that the sacrificial layer pattern remains on the spacer after the spacer is formed, and further comprising removing the sacrificial layer pattern by soaking the sacrificial layer pattern with a second wet etching solution having a composition different from that of the first wet etching solution.

7. The method of claim 6, wherein the spacer is formed as the sacrificial layer pattern is being formed.

8. The method of claim 6, wherein the spacer formation layer includes at least one film of material selected from the group consisting of silicon oxide, silicon nitride, silicon carbon nitride and silicon oxynitride.

* * * * *